(12) United States Patent
Strobel

(10) Patent No.: US 7,430,871 B2
(45) Date of Patent: Oct. 7, 2008

(54) NMR SPECTROMETER WITH A COMMON REFRIGERATOR FOR COOLING AN NMR PROBE HEAD AND CRYOSTAT

(75) Inventor: Marco Strobel, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 319 days.

(21) Appl. No.: 11/266,360

(22) Filed: Nov. 4, 2005

(65) Prior Publication Data

US 2006/0097146 A1 May 11, 2006

(30) Foreign Application Priority Data

Nov. 9, 2004 (DE) .................. 10 2004 053 972

(51) Int. Cl.
*F25B 19/00* (2006.01)
*B01D 59/44* (2006.01)
*H01J 49/40* (2006.01)
*H01F 6/04* (2006.01)

(52) U.S. Cl. .................. 62/51.1; 250/286; 356/326; 324/321; 335/216

(58) Field of Classification Search .................. 62/51.1; 250/286; 356/326; 324/321, 318; 335/216
See application file for complete search history.

(56) References Cited

U.S. PATENT DOCUMENTS

| | | | |
|---|---|---|---|
| 4,510,771 A * | 4/1985 | Matsuda et al. | ............... 62/51.1 |
| 4,796,433 A * | 1/1989 | Bartlett | ...................... 62/47.1 |
| 5,220,800 A * | 6/1993 | Muller et al. | ................. 62/51.1 |
| 5,508,613 A | 4/1996 | Kotsubo et al. | |
| 5,889,456 A | 3/1999 | Triebe | |
| 6,389,821 B2 | 5/2002 | Strobel | |
| 2005/0046423 A1 | 3/2005 | Marek | |
| 2005/0202976 A1* | 9/2005 | Killoran | ..................... 505/200 |

FOREIGN PATENT DOCUMENTS

| | | |
|---|---|---|
| EP | 1 560 035 | 8/2005 |
| JP | 2004219361 | 8/2004 |
| WO | WO 03/023433 | 3/2003 |

* cited by examiner

*Primary Examiner*—William C Doerrler
(74) *Attorney, Agent, or Firm*—Paul Vincent

(57) ABSTRACT

An NMR spectrometer comprising a magnet coil system disposed in the helium tank (8) of a cryostat and an NMR probe head (4) which is disposed in a room temperature bore of the cryostat and contains a cooled RF resonator (13) for receiving NMR signals from a sample to be examined, wherein the helium tank (8) and the NMR probe head (4) are cooled by a common, multi-stage, compressor-operated refrigerator, is characterized in that the common refrigerator comprises a cold head (6) and several heat exchangers (21, 24, 25, 28, 31, 33, 34) at different temperature levels, wherein the refrigerator is disposed at a spatial separation from the cryostat in a separate, evacuated and thermally insulated housing (5), and several cooling circuits (1a, 1b, 1c, 1d, 2a, 2b, 3a, 3b) having thermally insulated transfer lines (14a, 14b, 15) are provided between the housing (5) containing the heat exchangers (21, 24, 25, 28, 31, 33, 34) and the cryostat, and also between the housing (5) and the NMR probe head (4). The probe head and magnet cryostat of the inventive NMR spectrometer can thereby be cooled by a common refrigerator, wherein the cooling resources of the used refrigerator are optimally utilized.

18 Claims, 4 Drawing Sheets

NMR SPECTROMETER WITH A COMMON REFRIGERATOR FOR COOLING AN NMR PROBE HEAD AND CRYOSTAT

This application claims Paris Convention priority of DE 10 2004 053 972.3 filed Nov. 09, 2004 the complete disclosure of which is hereby incorporated by reference.

BACKGROUND OF THE INVENTION

The invention concerns an NMR spectrometer comprising a magnet coil system which is disposed in the helium tank of a cryostat, and an NMR probe head which is disposed in a room temperature bore of the cryostat and contains a cooled RF resonator for receiving NMR signals from a sample to be examined, wherein the helium tank and the NMR probe head are cooled by a common, multi-stage, compressor-operated refrigerator.

A device of this type is disclosed in WO 03/023433 A1.

The NMR probe head of an NMR spectrometer is located, together with a measuring device, in the bore of a magnet cryostat. This magnet cryostat contains a superconducting coil which generates the magnetic field required for NMR measurements. The NMR probe head as well as the magnet cryostat must be kept at very low temperatures during operation. The thermal loss caused by thermal conduction and thermal radiation is therefore a problem.

For this reason, a refrigerator is conventionally provided for cooling the NMR probe head. Heat exchangers and a transfer line from the refrigerator to the NMR probe head transfer the cooling power generated by the refrigerator (U.S. Pat. No. 5,889,456). The NMR probe head is supplied with coolant through pumps or compressors via the transfer lines. The cooled components of the probe head are usually at temperatures of 10 to 60 Kelvin. A Gifford-MacMahon cooler (GM) or pulse tube cooler (PT) is e.g. used as refrigerator.

The magnet cryostat of an NMR spectrometer comprises a helium tank which contains the superconducting magnet and liquid helium (4.2 K), one or more radiation shields surrounding the helium tank, an outer vacuum container which is subsequently referred to as the outer shell, and one or more neck tubes which connect the helium tank to the outer shell. The radiation shields may also be containers which are filled with liquid nitrogen (77.3 K) to reduce the heat input into the helium tank. Helium and nitrogen are evaporated by the heat input into the helium tank and on the radiation shield which results from radiation and thermal conduction of the neck tubes and further suspension means. To prevent evaporation of expensive helium and nitrogen, refrigerators (PT or GM coolers) are also used to cool magnet cryostats.

It is thereby also possible to connect the refrigerator to the magnet cryostat via transfer lines. The transfer line between the refrigerator and the cryostat must, however, be highly efficient to transfer the thermal flows with little loss. The structure of this design is less compact and it is therefore not used in modern magnet cryostats.

It has proven to be useful to install the cold finger directly in the magnet cryostat. The cold finger is thereby connected to one or more shields in the cryostat and/or condenses evaporated helium in the helium tank. This method is advantageous in that direct cooling is more efficient than external arrangement of the refrigerator and transport of the coolant via a transfer line. A design of this type is described in U.S. Pat. No. 6,389,821. In this method, more helium is condensed than evaporated. For this reason, part of the cooling power must be compensated for by an electric heating means. In this case, part of the cooling power is also "wasted", without being used.

WO 03/023433 A1 therefore proposes use of the cold finger of the refrigerator which is installed in the magnet cryostat not only for cooling the cryostat but also for cooling the NMR probe head. The installation of the refrigerator in the magnet cryostat, however, entails considerable disadvantages. The generally magnetic regenerator material is located within the stray field of the NMR magnet coil and therefore generates magnetic disturbances. The vibrations which are caused directly by the refrigerator deteriorate the measuring conditions. Moreover, the limited space within the magnet cryostat prohibits arbitrary positioning of the heat exchangers, which limits the possibility of setting the pre-cooling temperature. For this reason, these devices frequently fail to reach an optimum cooling operation. A considerable part of the input power of the cooler, which is approximately 4 to 8 kW, is still lost in these conventional devices.

It is therefore the underlying purpose of the invention to propose an NMR spectrometer with which the probe head and magnet cryostat are cooled by a common refrigerator, wherein the cooling resources of the refrigerator are optimally utilized while minimizing the disturbances in the working volume caused by the refrigerator.

SUMMARY OF THE INVENTION

This object is achieved in accordance with the invention in that the common refrigerator comprises a cold head and several heat exchangers at different temperature levels, wherein the refrigerator is disposed at a spatial separation from the cryostat in a separate, evacuated and thermally insulated housing, and several cooling circuits with thermally insulated transfer lines are provided between the housing containing the heat exchangers and the cryostat and also between the housing and the NMR probe head.

The overall cooling power is generated outside of the cryostat by a refrigerator and is transferred using suitable coolants via an insulated transfer line to the components to be cooled. This prevents mechanical and magnetic disturbances of the magnetic field by the refrigerator and also permits utilization of the excess energy produced in the different cooling circuits for cooling further cooling circuits. Moreover, the more variable arrangement of the heat exchangers permits more effective setting of the pre-cooling temperature to save energy.

This arrangement is therefore much more effective and less expensive compared with a cold head integrated in a cryostat as described e.g. in WO03/023433 A1 and also compared with the arrangement disclosed in U.S. Pat. No. 5,889,456 which provides separate refrigerators for cooling the NMR probe head and the cryostat. It is thereby possible to save up to 100% of the input power and purchasing costs.

In a preferred embodiment of the present NMR spectrometer, the thermally insulated transfer lines of the cooling circuits have a common thermally insulated line section which comprises at least 50%, in particular at least 70%, preferably approximately 90% of the overall length of the transfer lines. This reduces the temperature loss during transfer of the coolant to the objects to be cooled.

In one particularly preferred embodiment of the invention, the transfer line which is at the lowest energy level is thermally shielded within the common line section by at least one radiation shield at a higher energy level. The transfer line with the lowest energy level is thereby subjected to a reduced temperature difference which reduces the energy loss and the line section insulation requirements.

In a particularly advantageous manner, the transfer lines are disposed coaxially, wherein the transfer line with the lowest energy level is in the center of the arrangement.

In a preferred embodiment, the transfer lines have vibration-damping components for decoupling the refrigerator from the NMR probe head or the refrigerator from the cryostat. The quality of the NMR measurements is thereby improved.

Two cooling circuits are advantageously provided between the housing and the cryostat, one cooling circuit of which has a temperature level of approximately 77 K. It may cool a radiation shield or a nitrogen tank.

It is moreover advantageous to also provide two cooling circuits between the housing and the NMR probe head, one cooling circuit having a temperature level of approximately 77 K. A pre-amplifier of the NMR probe head may e.g. be cooled by a cooling circuit of this type.

The cooling circuits which have a temperature level of approximately 77 K are thereby preferably operated with liquid nitrogen (=LN2) coolant. The nitrogen is condensed at the cold head and is guided in liquid form through the transfer line, thereby increasing the average transfer temperature of the cooling power and improving the efficiency.

In a particularly advantageous manner, one of the cooling circuits between the housing and the cryostat has a temperature level of approximately 4 K and is operated with liquid helium (=LHe) as coolant. It may cool e.g. a helium tank located in the cryostat.

In a particularly preferred embodiment of the inventive NMR spectrometer, the common refrigerator comprises a regenerator along which at least one coolant is guided to pre-cool this coolant to a defined temperature. One of the heat exchangers can therefore be omitted. It is also possible to individually adjust the temperature of the coolant through selecting the length of the contact surface between transfer line and the regenerator.

This can be realized in a particularly good manner if the common refrigerator is a pulse tube cooler. Mounting of the transfer lines to the stationary regenerator tube of a pulse tube cooler is thereby considerably facilitated as is the temperature exchange compared to a movable regenerator of a Gifford-McMahon cooler for which this arrangement would be difficult to realize.

In a special embodiment of the inventive NMR spectrometer, the cryostat contains a helium tank and a Joule-Thomson valve which is disposed in the helium tank and is integrated in one of the cooling circuits. In this Joule-Thomson valve, the helium flow is further cooled due to adiabatic relaxation to cool the helium tank, and is partially liquefied. The temperature after relaxation is lower than the temperature of the second stage of the refrigerator, e.g. 6 Kelvin at the refrigerator and 4.2 K downstream of the Joule-Thomson valve. The second refrigerator stage can accept a considerably larger amount of power in consequence of this temperature increase, compared to cooling of the coolant to 4.2 K without a Joule-Thomson valve (100-300%). The NMR probe head usually requires more power in the lower temperature range than the helium tank of the cryostat. Moreover, it is not necessary to cool the NMR probe head to 4.2 K. The Joule-Thomson valve can split the power of the second stage into two temperature levels. The effectivity of the overall system is thereby considerably improved. In a particularly advantageous manner, the housing containing the cold head and the heat exchangers is disposed above the cryostat. In this arrangement, the pump for circulating the coolant and the associated valves can be omitted due to gravity and inherent convection of the coolant. No additional heat is input through pump operation and the efficiency of the overall apparatus is increased.

Furthermore, it may also be advantageous for the refrigerator compressor to also drive at least one of the cooling circuits.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 1:
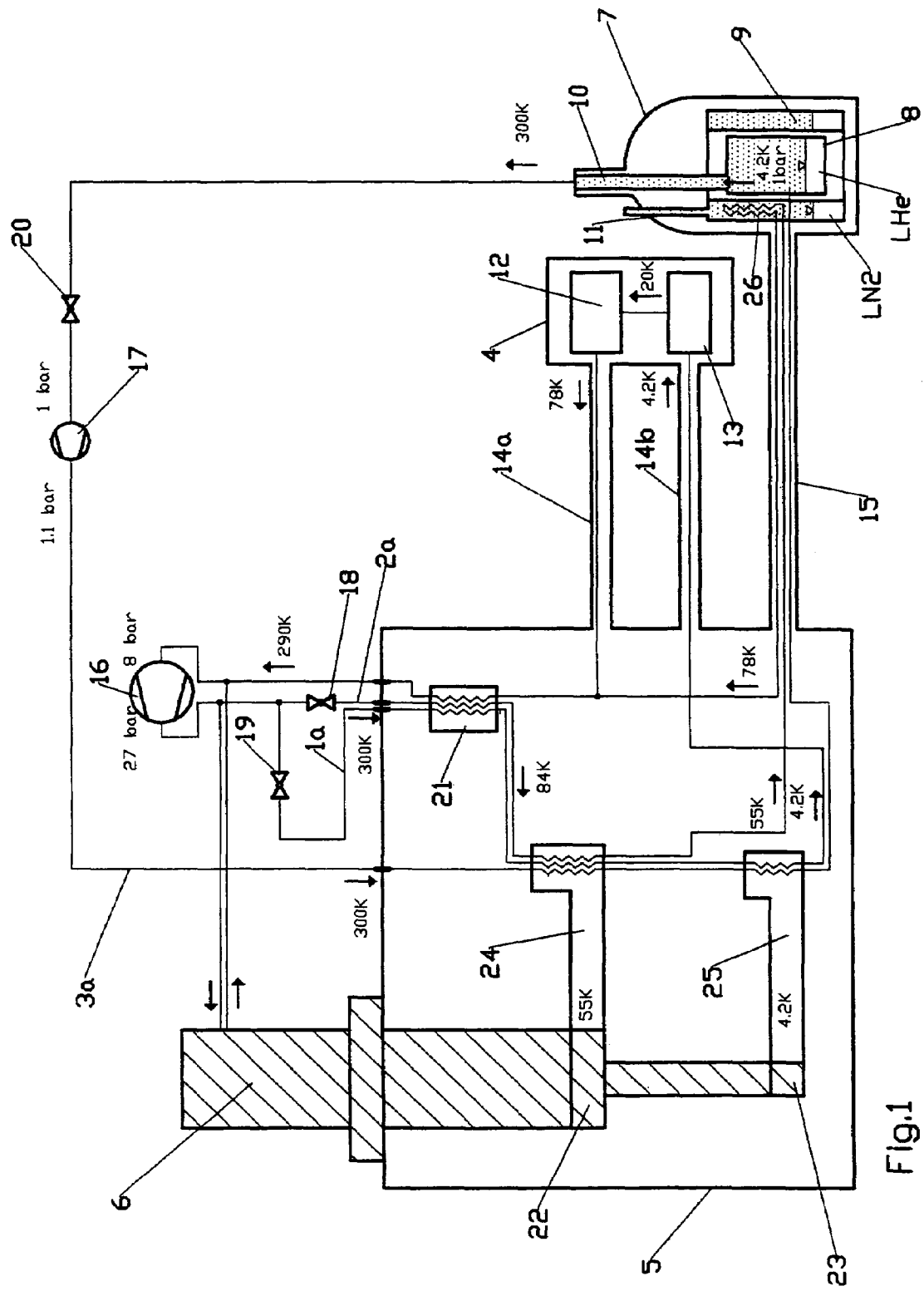
FIG. 1 shows a schematic view of an embodiment of the inventive arrangement.

The figures explained below show different embodiments of the inventive NMR spectrometer with associated cooling circuits $1a$, $1b$, $1c$, $1d$, $2a$, $2b$, $3a$, $3b$. The NMR spectrometer also comprises a cryostat, an NMR probe head 4 and a cold head 6 of a refrigerator which is preferably designed as a pulse tube cooler and disposed in a separate evacuated and thermally insulated housing 5 to prevent thermal input through convection and gas heat conduction. The drawings do not show the insulation from thermal radiation.

The essential components of the cryostat are an outer shell 7 and a helium tank 8 which contains a superconducting magnet and liquid helium (4.2 K), a nitrogen tank 9 which contains liquid nitrogen and one or more neck tubes 10 which connect the helium tank 8 to the outer shell 7. The nitrogen tank 9 also comprises one or more neck tubes 11 of this type.

The NMR probe head 4 contains the resonator 13 and the pre-amplifier 12. Each coolant is transported through vacuum-insulated transfer lines 14, 15. These lines 14, 15 may have a length of several meters and are illustrated with greatly reduced length. The NMR probe head 4 may be connected in many different ways (see U.S. Pat. No. 5,889,456). In the present variants, the simplest connections are illustrated.

The embodiment of FIG. 1 of the inventive NMR spectrometer comprises three cooling circuits $1a$, $2a$, $3a$ for cooling the NMR probe head 4 and/or re-condensating gases evaporating in the nitrogen tank 9 or helium tank 8. Cooling circuit $1a$ supplies the NMR probe head 4, cooling circuit $2a$ supplies the nitrogen tank 9, and cooling circuit $3a$ supplies the helium tank 8 of the cryostat with coolant. A compressor 16 condenses the helium used as coolant for the cold head 6 and the cooling circuits $1a$, $2a$ of the NMR probe head 4 and the nitrogen tank 9 of the magnet cryostat. A second compressor or a pump 17 drives the cooling circuit $3a$ for the helium tank 8 of the magnet cryostat. This is required, since the pressure on the low-pressure side of the first compressor 16 (usually approximately 5 bars) is above the critical pressure for helium. For this reason, it would not be possible to keep a liquid helium supply in the helium tank 8. The flow rate of the cooling circuits 1a, 2a, 3a is regulated by valves 18, 19, 20.

Cooling Circuit 1a of the NMR Probe Head 4:

For cooling the NMR probe head 4, a coolant (He gas flow in the present example) at room temperature enters the housing 5 downstream of the compressor 16 and is pre-cooled in a heat exchanger 21 in counter flow with the gases flowing out of the NMR probe head 4 and the nitrogen coolant. The coolant is further cooled and liquefied in the heat exchangers 24, 25 connected to the first stage 22 and second stage 23 of the cold head 6. The helium used as coolant then has a temperature of approximately 4.2 K. After passage through the transfer line 14b, the helium is heated in the resonator 13 and subsequently in the pre-amplifier 12 to approximately 70 to 90 K and cools the NMR resonator 13 to approximately 6 to 20 K and the pre-amplifier 12 to approximately 70 K. The coolant is returned to the housing 5 through the transfer line 14a, where it is mixed with the cooling gas of the nitrogen coolant from the cooling circuit 2a and is subsequently heated in the heat exchanger 21 to just below the ambient temperature (approximately 290 K) and returned to the compressor 16.

Cooling Circuit 2a of the Nitrogen Tank 9:

In the cooling circuit 2a, a coolant flow (He gas flow in the present example) at room temperature (approximately 300 K) enters the housing 5 downstream of the compressor 16 and is pre-cooled in the heat exchanger 21 in counter flow with the gases flowing out of the NMR probe head 4 and the nitrogen coolant and is further cooled in the heat exchanger 24 connected to the first stage 22 of the cold head 6 to a temperature below 77 K (preferably approximately 55 K). After passage through the transfer line 15, the helium passes through a heat exchanger 26. The heat exchanger 26 is located in the nitrogen gas and re-liquefies gaseous nitrogen. The coolant of the cooling circuit 2a accepts heat from the nitrogen tank 9 and returns to the housing 5 via the transfer line 15, where it is mixed with the cooling gas for cooling the NMR probe head from the cooling circuit 1a and is subsequently heated in the heat exchanger 21 to just below the ambient temperature and returned to the compressor 16.

Cooling Circuit 3a of the Helium Tank 8:

In the cooling circuit 3a, helium evaporating from the helium tank 8 is repumped. The He gas flow at room temperature enters the housing 5 downstream of the pump 17, is pre-cooled in the heat exchanger 24 and is further cooled and liquefied (approximately 4.2 K) in the heat exchanger 25. After passage through the transfer line 15, the liquid helium enters the helium tank 8. The helium gas evaporating from the helium tank escapes through the neck tube 10, is heated to room temperature, and is returned to the pump 17. The helium evaporating from the helium tank 8 may additionally also cool a radiation shield or the neck tubes 10.

Figure 2:
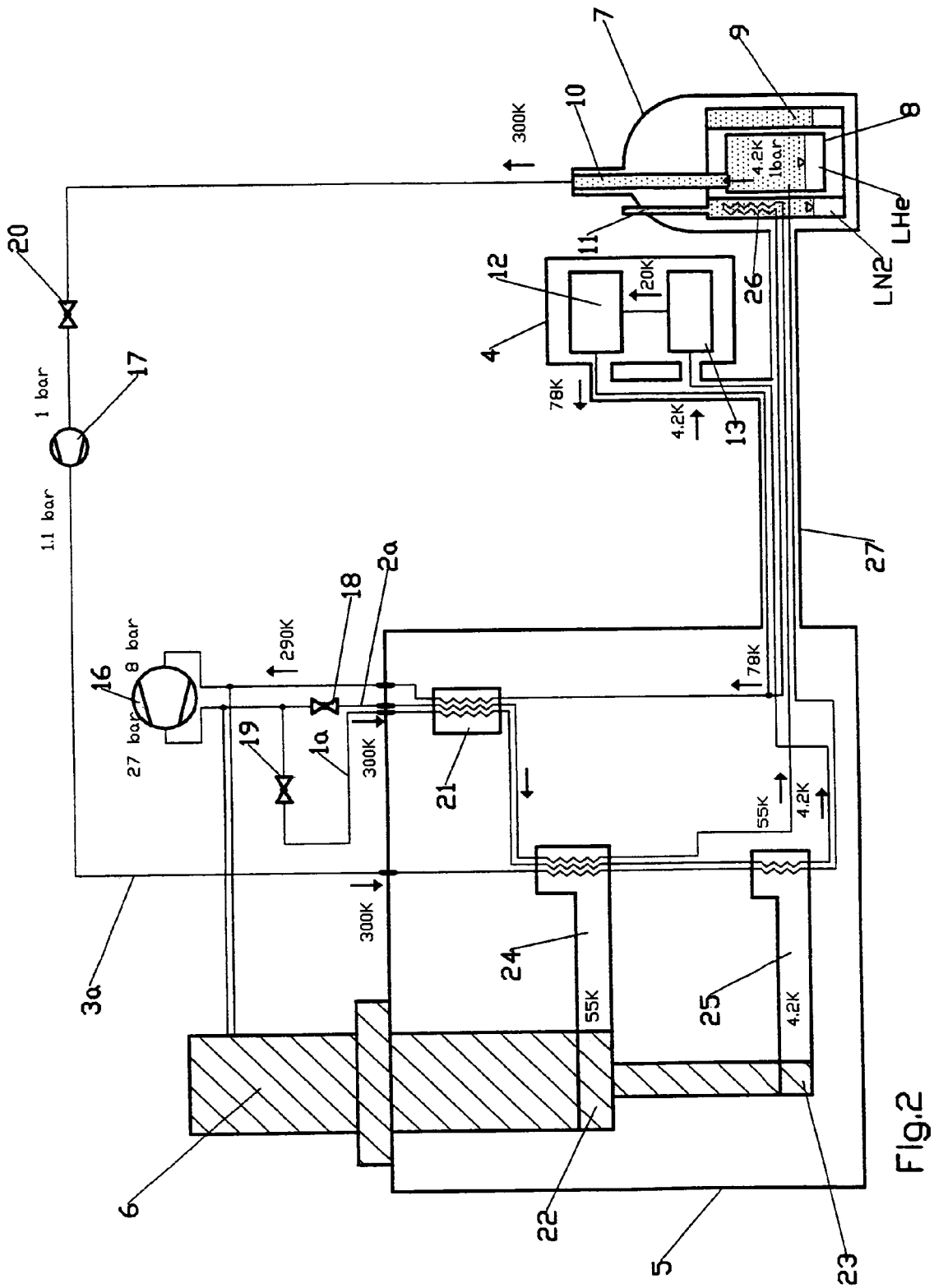
FIG. 2 shows a schematic view of a further embodiment of the inventive arrangement in accordance with FIG. 1 with a common transfer line section.

FIG. 2 shows an embodiment of the inventive NMR spectrometer, wherein the transfer lines 14a, 14b, 15, which are separate in FIG. 1, have a common line section 27. The transfer lines can thereby be disposed in such a manner that the warmer sections of the cooling circuits can shield the colder ones from room temperature along a major part of the overall length of the transfer lines 14a, 14b, 15. This may be realized e.g. by coaxial arrangement of the transfer lines 14a, 14b, 15 or through a suitable arrangement of radiation shields which surround the transfer line at the lowest energy level. In this manner, the coolants can be transferred along the path between the housing 5 and the cryostat or between the housing 5 and the NMR probe head 4, thereby minimizing the temperature loss.

Figure 3:
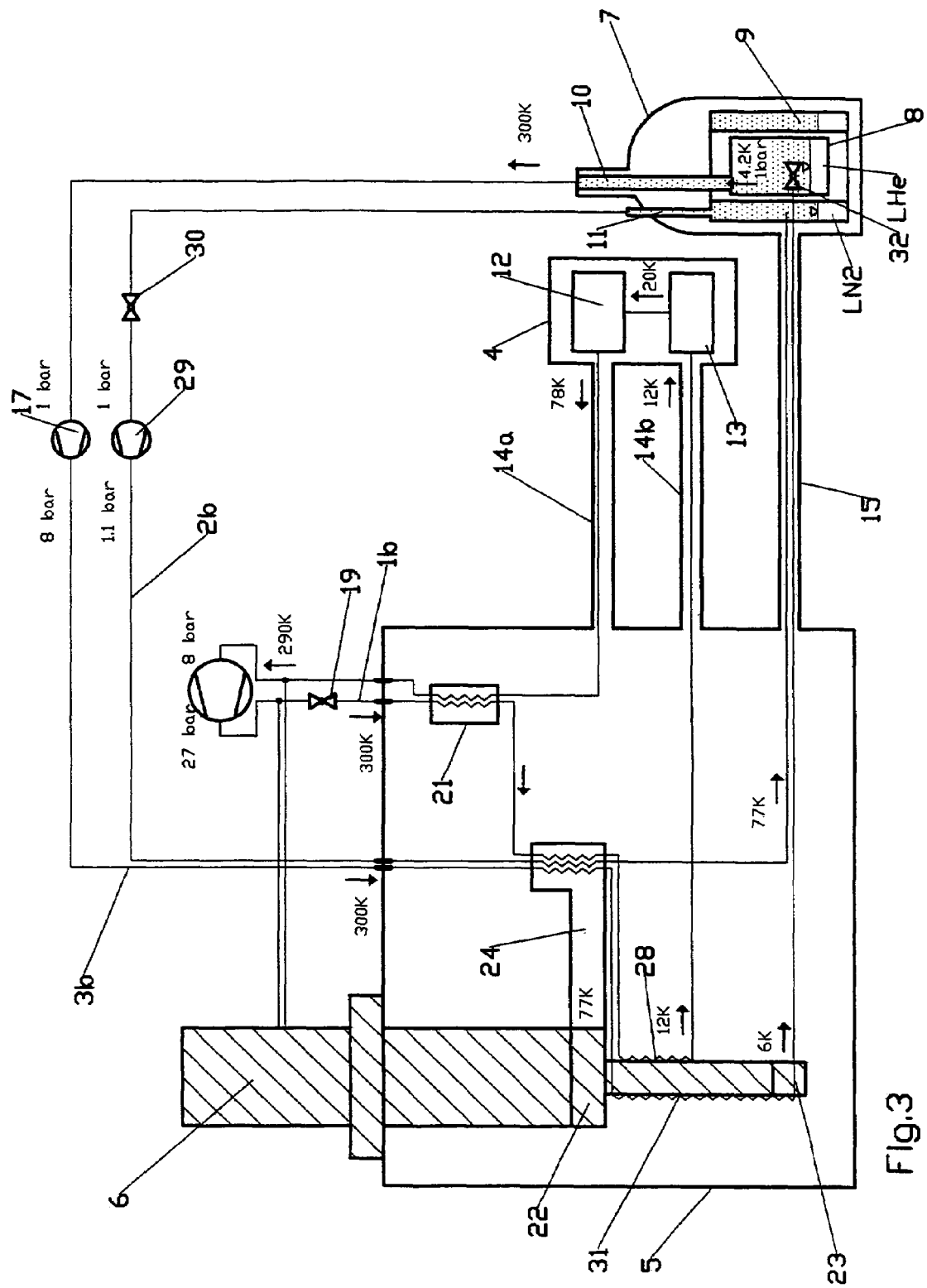
FIG. 3 shows a schematic view of an embodiment of the inventive arrangement with a cooling circuit operated with nitrogen and a Joule-Thomson valve which is integrated in one of the cooling circuits and pre-cooling of the coolant along the regenerator of the second refrigerator stage.

FIG. 3 shows a further embodiment of the inventive NMR spectrometer with cooling circuits 1b, 2b, 3b which are modified compared to FIG. 1.

Cooling Circuit 1b of the NMR Probe Head 2:

Like in the embodiment of FIG. 1, in the present embodiment, the He gas flow at room temperature enters the housing 5 downstream of the compressor 16 and is pre-cooled in the heat exchanger 21 in counter flow with the gases flowing out of the NMR probe head 4, and is subsequently cooled in the heat exchanger 24 which is connected to the first stage 22 of the cold head 6. The coolant is further cooled by a heat exchanger 28 connected to the second stage 23 of the cold head 6. The heat exchanger 28 is thereby connected to the regenerator tube of the second stage 23 of the cold head 6 and does not guide the helium to the cold end of the second stage 23 of the cold head 6 but merely to a location where the coolant has a temperature suitable for cooling the NMR probe head 4. After passage through the transfer line 14b, the helium is heated in the resonator 13 and subsequently in the pre-amplifier 12 to approximately 70 to 100 K and is returned to the housing 5 via the transfer line 14a where it is heated in the heat exchanger 21 to just below the ambient temperature and returned to the compressor 16. Due to the freely selectable length of the contact surfaces between the coolant and regenerator, the pre-cooling temperature of the coolant can be optimally adjusted to the desired application. This temperature adjustment is possible only if the refrigerator is externally disposed as proposed in the present invention and cannot be realized with a refrigerator which is integrated in the cryostat, due to the limited space.

Cooling Circuit 2b of the Nitrogen Tank 9:

In the cooling circuit 2b of FIG. 2, nitrogen gas flow is used to cool the nitrogen tank 9. The nitrogen gas flow at room temperature enters the housing 5 downstream of a pump 29 and is cooled and liquefied in the heat exchanger 24. After passage through the transfer line 15, the liquid nitrogen flows into the nitrogen tank 9, where it is evaporated through the thermal energy introduced in the nitrogen tank, leaves the magnet cryostat through the neck tube 11 and returns to the pump 29. The mass flow is adjusted by the valve 30. Due to use of nitrogen as coolant, the coolant is transferred through the transfer line 15 in a liquid state, which increases the average transfer temperature of the cooling power, improves the efficiency and reduces the consumption of expensive helium. However, an additional pump 29 and a valve 30 are required for repumping the nitrogen.

Cooling Circuit 3b of the Helium Tank 8:

As described already in connection with the cooling circuit 1b, the helium gas required for the cooling circuit 3b may also be cooled by a heat exchanger 31, which is connected to the second stage 23 of the cold head 6, to a defined temperature and be liquefied after precooling by the heat exchanger 24. After passage through the transfer line 15, the liquid helium is expanded into the helium tank 8 via the Joule-Thomson valve 32, where it is evaporated. The helium gas subsequently flows through the neck tube 10, is heated to room temperature and is returned to the pump 17. Due to the expansion of the helium gas via the Joule-Thomson valve 32, additional heat is withdrawn from the helium in the helium tank, thereby increasing the cooling power of the cooling circuit 3b. It would be theoretically possible to use a less powerful refrigerator for the cooling circuit 3b. In practice, the cooling power obtained in this manner is utilized to increase the power supply to the cooling circuit 1b of the NMR probe head. Moreover, the compressor for the Joule-Thomson valve 32 also draws considerably less power (less than 10%) than the compressor of the refrigerator.

Figure 4:
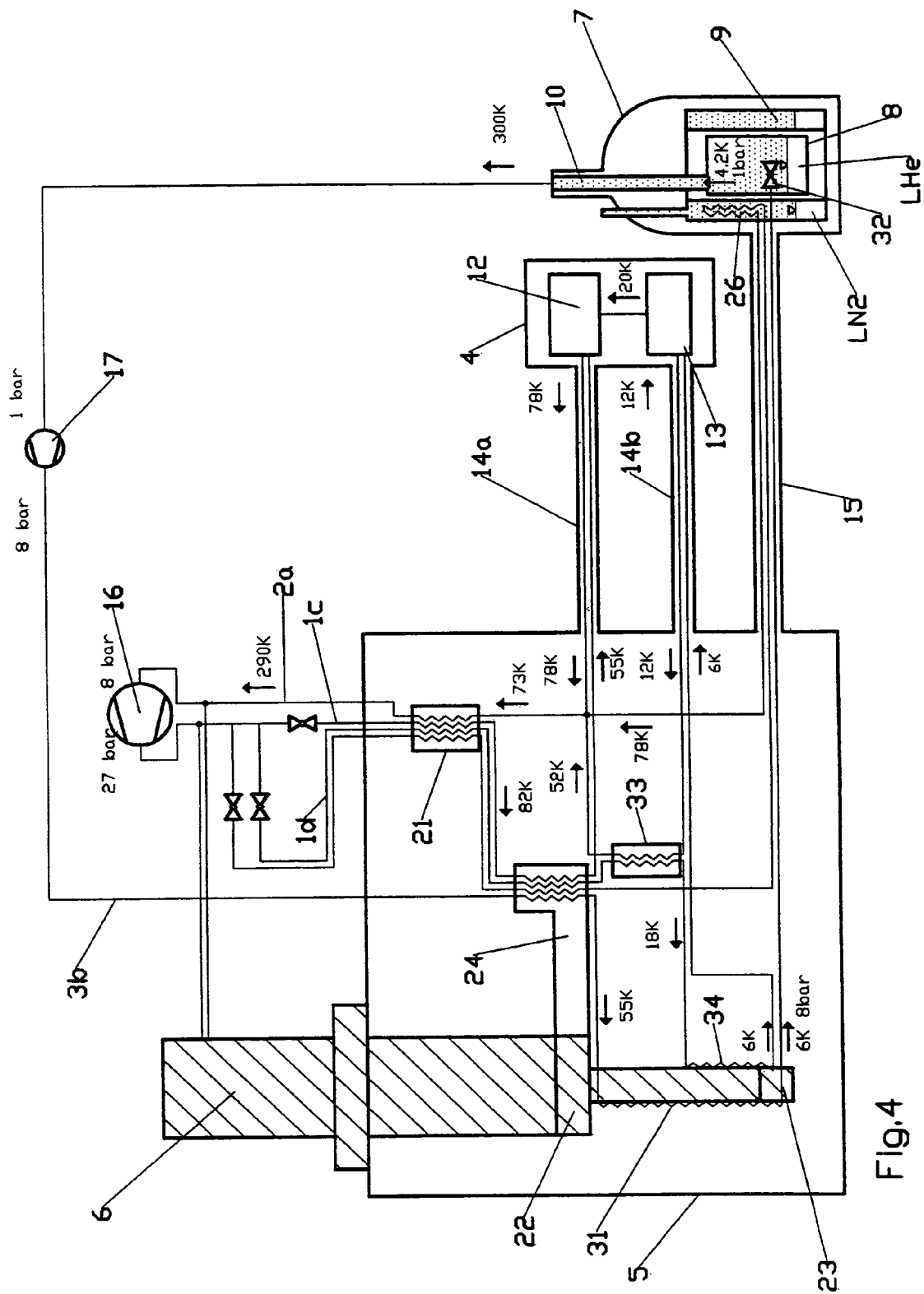
FIG. 4 shows a schematic view of a further embodiment of the inventive arrangement with two cooling circuits for cooling the NMR probe head.

FIG. 4 shows an embodiment of the inventive NMR spectrometer, wherein the resonator 13 and the pre-amplifier 12 of the NMR probe head 4 are cooled using two separate cooling circuits 1d, 1c.

Cooling Circuit 1c of the Pre-Amplifier 12:

Analogously to the cooling circuit 2a of the nitrogen tank 9, the coolant at room temperature enters the housing 5 downstream of the compressor 16 and is pre-cooled in the heat exchanger 21 in counter flow with the gases flowing out of the NMR probe head 4 and the nitrogen coolant, and is cooled in the heat exchanger 24 connected to the first stage 22 of the cold head 6 to a temperature below 77 K (preferably approximately 55 K). The coolant is not further cooled within the cooling circuit 1c. Nitrogen would be suitable as a coolant for this cooling circuit 1c, since nitrogen is in its liquid state at this temperature. After passage through the transfer line 14a, the coolant is heated in the pre-amplifier 12 to approximately 70 to 100 K and returned to the housing 5 through the transfer line 14a where it is heated in the heat exchanger 21 to just below the ambient temperature, and returned into the compressor 16.

Cooling Circuit 1d of the Resonator 13:

Cooling of the resonator 13 requires lower temperatures than cooling of the pre-amplifier 12. For this reason, after passage through the heat exchanger 24 which is connected to the first stage 22 of the cold head 6, the coolant is cooled in a further heat exchanger 33 by the return flow of the coolant to a temperature of approximately 18 K, and in a heat exchanger 34 which is connected to the regenerator tube, to the desired temperature of approximately 6K, before it reaches the resonator 13 via the transfer line 14b. The coolant flows back through the transfer line 14b and the heat exchangers 24, 21 which are at a higher temperature level, such that the coolant can accept heat from the inflowing coolant while returning to the compressor 16.

The nitrogen tank of the NMR spectrometer shown in FIG. 4 is cooled analogously to the cooling circuit 2a of FIG. 2. The cooling circuit 3b of the helium tank, however, corresponds to the one of FIG. 3.

The features of the individual cooling circuits 1a, 1b, 1c, 1d, 2a, 2b, 3a, 3b can, of course, be combined in different ways. In particular, the advantages of all embodiments of the invention can be utilized with particular advantage if the transfer lines 14a, 14b, 15 have a common line section 27 as is exemplarily shown in FIG. 2, thereby realizing particularly effective coolant transfer.

Due to external arrangement of the refrigerator, the inventive device is a system which is extremely insensitive to disturbances. Since the refrigerator is located at a relatively large separation from the working volume of the NMR spectrometer, mechanical and also magnetic disturbances caused e.g. by the regenerator material are not transferred to the magnet coil system. The regenerator material can therefore be selected more freely to optimize cooling. In addition to effective cooling, the inventive device therefore also achieves good homogeneity of the magnetic field within the working volume of the NMR spectrometer. The shape and dimensions of the regenerator tube of the inventive external arrangement can, in principle, be freely selected due to the relaxed geometric boundary conditions, whereas for a refrigerator which is integrated in a cryostat, a compromise must always be found between cooling power and spatial extension of the refrigerator. The inventive NMR spectrometer realizes cooling of the NMR probe head and liquid tanks in the cryostat with one single refrigerator which is disposed at a separation from the cryostat. Omission of device components and the flexibility of arrangement of the present heat exchangers whose temperature levels can be optimized to the required cooling temperatures permit highly effective utilization of the cooling power of the refrigerator.

LIST OF REFERENCE NUMERALS 1a,1b cooling circuit NMR probe head
1c cooling circuit pre-amplifier
1d cooling circuit resonator
2a,2b cooling circuit nitrogen tank
3a,3b cooling circuit helium tank
4 NMR probe head
5 housing
6 cold head
7 outer shell
8 helium tank
9 nitrogen tank
10 neck tube in the helium tank
11 neck tube in the nitrogen tank
12 pre-amplifier
13 resonator
14a,b transfer lines NMR probe head
15 transfer line cryostat
16 compressor
17 pump
18 valve
19 valve
20 valve
21 heat exchanger
22 first cold head stage
23 second cold head stage
24 heat exchanger (first stage 55 K)
25 heat exchanger (second stage 4.2 K)
26 heat exchanger (nitrogen tank)
27 line section
28 heat exchanger (12 K)
29 pump
30 valve
31 heat exchanger (4.2 K)
32 Joule-Thomson valve
33 heat exchanger (18 K)
34 heat exchanger (6 K)

I claim:

1. An NMR spectrometer for examination of a sample, the spectrometer comprising:

a cryostat having a room temperature bore;
a helium tank disposed in said cryostat;
a magnet coil system disposed in said helium tank;
an NMR probe head disposed in said room temperature bore of said cryostat;
a cooled RF resonator disposed in said probe head for receiving NMR signals from the sample;
an evacuated and thermally insulated housing disposed at a spatial separation from said cryostat;
a multi-stage, compressor-operated refrigerator disposed in said housing, said refrigerator having a first stage at a first temperature and a second stage, said second stage having a cold head at a second temperature, said second stage having a first region proximate to said first stage having a third temperature intermediate between said first temperature and said second temperature and a second region proximate to said cold head having a fourth temperature intermediate between said third temperature and said second temperature;

a first cooling circuit, said first cooling circuit having a first heat exchanger in thermal contact with said second region, said first cooling circuit structured to transport helium, liquefied by said first heat exchanger, from said first heat exchanger to said helium tank, said first cooling circuit having a Joule-Thompson valve disposed within said helium tank to accept liquid helium from said first heat exchanger and a first compressor connected between said helium tank and said refrigerator to accept and pressurize helium gas escaping from said helium tank and to pass that gas to said refrigerator for completion of said first cooling circuit; and a thermally insulated transfer line system disposed about said first cooling circuit and extending between said housing and said cryostat.

2. The NMR spectrometer of claim 1, further comprising a cooled preamplifier disposed within said probe head to accept signals from said resonator and a second cooling circuit, said second cooling circuit having a second heat exchanger in thermal contact with said first region, said second cooling circuit structured to transport helium gas from said second heat exchanger to said resonator and from said resonator to said preamplifier before returning that helium gas to said housing for completion of said second cooling circuit, wherein said thermally insulated transfer line system is disposed about said second cooling circuit and extends between said housing and said probe head.

3. The NMR spectrometer of claim 2, further comprising a nitrogen tank and a third cooling circuit, said nitrogen tank disposed within said cryostat and surrounding said helium tank, said third cooling circuit having a third heat exchanger in thermal contact with said first stage, said third cooling circuit structured to pass nitrogen, liquefied in said third heat exchanger, from said third heat exchanger to said nitrogen tank, said third cooling circuit having a valve disposed outside said nitrogen tank to control a flow of nitrogen gas evaporated from said nitrogen tank and with a pump disposed between said nitrogen tank and said refrigerator in series with said valve to transport that nitrogen gas back to said refrigerator for completion of said third cooling circuit, wherein said thermally insulated transfer line system is disposed about said third cooling circuit and extends between said housing and said cryostat.

4. The NMR spectrometer of claim 3, wherein said thermally insulated transfer line system has a common thermally insulated line section which comprises at least 50% of an overall length of said transfer line system.

5. The NMR spectrometer of claim 4, wherein said thermally insulated transfer line system has a common thermally insulated line section which comprises at least 70% of an overall length of said transfer lines.

6. The NMR spectrometer of claim 5, wherein said thermally insulated transfer line system has a common thermally insulated line section which comprises at least 90% of an overall length of said transfer lines.

7. The NMR spectrometer of claim 4, wherein a transfer line which is at a lowest energy level is thermally shielded within said common line section by at least one radiation shield which is at a higher energy level.

8. The NMR spectrometer of claim 3, wherein said transfer line system comprises coaxially disposed transfer lines.

9. The NMR spectrometer of claim 1, wherein said transfer line system comprises vibration-damping components for decoupling said refrigerator and said NMR probe head or said refrigerator and said cryostat.

10. The NMR spectrometer of claim 3, wherein two cooling circuits are provided between said housing and said cryostat, wherein one cooling circuit thereof has a temperature level of approximately 77 K.

11. The NMR spectrometer of claim 2, wherein two cooling circuits are provided between said housing and said NMR probe head, wherein one cooling circuit thereof has a temperature level of approximately 77 K.

12. The NMR spectrometer of claim 10, wherein a cooling circuit which is at a temperature level of approximately 77 K is operated with liquid nitrogen (=$LN_2$) as coolant.

13. The NMR spectrometer of claim 11, wherein a cooling circuit which is at a temperature level of approximately 77 K is operated with liquid nitrogen (=$LN_2$) as coolant.

14. The NMR spectrometer of claim 1, wherein one cooling circuit is located between said housing and said cryostat at a temperature level of approximately 4 K and is operated with liquid helium (=LHe) as coolant.

15. The NMR spectrometer of claim 1, wherein said refrigerator comprises a regenerator along which at least one coolant is guided for pre-cooling that coolant to a defined temperature.

16. The NMR spectrometer of claim 1, wherein said refrigerator is a pulse tube cooler.

17. The NMR spectrometer of claim 1, wherein said housing is disposed above said cryostat.

18. The NMR spectrometer of claim 1, wherein said compressor of said refrigerator additionally drives at least one cooling circuit.

* * * * *